(12) United States Patent
Huang et al.

(10) Patent No.: US 11,451,237 B2
(45) Date of Patent: Sep. 20, 2022

(54) SAMPLE AND HOLD CIRCUIT AND METHOD

(71) Applicant: REALTEK SEMICONDUCTOR CORPORATION, Hsinchu (TW)

(72) Inventors: Shih-Hsiung Huang, Hsinchu (TW); Wei-Chou Wang, Hsinchu (TW); Chun-Hsiung Chang, Hsinchu (TW); Shun-Ta Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/353,858

(22) Filed: Jun. 22, 2021

(65) Prior Publication Data

US 2022/0149861 A1 May 12, 2022

(30) Foreign Application Priority Data

Nov. 6, 2020 (TW) ................................ 109138901

(51) Int. Cl.
*H03M 1/00* (2006.01)
*H03M 1/12* (2006.01)
*G11C 27/02* (2006.01)
*H03M 1/38* (2006.01)

(52) U.S. Cl.
CPC ............ *H03M 1/1245* (2013.01); *G11C 27/02* (2013.01); *H03M 1/38* (2013.01)

(58) Field of Classification Search
CPC .............................. H03M 1/1245; G11C 27/02
USPC .......................... 341/122, 155, 144, 118, 120
See application file for complete search history.

(56) References Cited

U.S. PATENT DOCUMENTS

| 7,741,981 B1 * | 6/2010 | Wan | H03M 1/02 341/110 |
|---|---|---|---|
| 9,136,863 B2 | 9/2015 | Lin | |
| 2011/0133963 A1 * | 6/2011 | Kawai | H03M 1/0845 341/110 |

FOREIGN PATENT DOCUMENTS

TW 201444297 A 11/2014

OTHER PUBLICATIONS

OA letter of the counterpart TW application(appl. No. 109138901) mailed on Jul. 23, 2021. Summary of the OA letter: Claims 1, 4, and 6 are rejected as being anticipated by the cited reference (TW 201444297 A).

* cited by examiner

*Primary Examiner* — Peguy Jean Pierre
(74) *Attorney, Agent, or Firm* — WPAT, PC

(57) ABSTRACT

Disclosed is a sample and hold circuit and method capable of amplifying an input signal. The method includes: in a sample phase, receiving a first (second) input signal with top electrodes of first (second) capacitors, and receiving the second (first) input signal with all bottom electrode(s) of at least a part of the first (second) capacitors; in a hold phase, stopping receiving the first (second) input signal with the top electrodes of the first (second) capacitors, and receiving a first (second) group of reference signals with the bottom electrodes of the first (second) capacitors, so that the first (second) capacitors provide a first (second) sample voltage on the top electrodes of the multiple first (second) capacitors through charge redistribution, wherein the first and second input signals are a pair of differential signals and they are opposite to each other.

15 Claims, 7 Drawing Sheets

SAMPLE AND HOLD CIRCUIT AND METHOD

BACKGROUND OF THE INVENTION

1. Field of the Invention

The present disclosure relates to a sample and hold circuit and method, especially to a sample and hold circuit and method capable of amplifying an input signal.

2. Description of Related Art

In an analog-to-digital conversion process, a programmable gain amplifier (PGA) amplifies an input analog signal and then provides the amplified signal for an analog-to-digital converter (ADC); afterwards, the ADC converts the amplified signal into a digital signal.

However, a PGA usually includes an operational amplifier, one or more resistors, and one or more capacitors, and therefore occupies a large circuit area and consumes a lot of power. If an input analog signal can be amplified with an existing circuit (e.g., a sample and hold circuit) of an ADC instead of a PGA, an analog-to-digital conversion process can be realized cost-effectively.

In addition, even though an input analog signal is amplified by a PGA, a further amplification is still helpful. More specifically, in consideration of the limitation on the output swing of a PGA, if an existing circuit (e.g., a sample and hold circuit) of an ADC further amplifies an amplified signal from the PGA, the efficacy of the whole analog-to-digital conversion process will be better.

SUMMARY OF THE INVENTION

An object of the present disclosure is to provide a sample and hold circuit and method capable of amplifying an input signal.

An embodiment of the sample and hold circuit of the present disclosure includes a control circuit, a first input switch, a first set of switches, a first capacitor array, a second input switch, a second set of switches, and a second capacitor array. The control circuit is configured to generate a first input switch control signal and a first set of switch control signals, and to generate a second input switch control signal and a second set of switch control signals. The first (second) input switch is configured to be turn on according to the first (second) input switch control signal in a sample phase and thereby transmit a first (second) input signal, and is configured to be turned off according to the first (second) input switch control signal in a hold phase. The first (second) set of switches is configured to operate according to the first (second) set of switch control signals. The first (second) capacitor array includes first (second) capacitors coupled to the first (second) input switch and the first (second) set of switches. In the sample phase, top electrodes of the first (second) capacitors receive the first (second) input signal through the first (second) input switch, and all bottom electrode(s) of at least a part of the first (second) capacitors receive(s) the second (first) input signal through the first (second) set of switches. In the hold phase, the top electrodes of the first (second) capacitors do not receive the first (second) input signal, all bottom electrodes of the first (second) capacitors receive a first (second) group of reference signals through the first (second) set of switches, and the first (second) capacitors provide a first (second) sample voltage on the top electrodes of the first (second) capacitors by charge redistribution. In an exemplary implementation, the first and second input signals are a pair of differential signals, and they are opposite to each other when the common-mode voltage is the ground voltage; since the top electrode(s) and the bottom electrode(s) of the at least a part of the first (second) capacitors receive the first (second) input signal and the second (first) input signal in the sample phase respectively, the signal strength of a signal sampled by the at least a part of the first (second) capacitors is two times the signal strength of the first (second) input signal, and this achieves the effect of signal amplification.

An embodiment of the sample and hold method of the present disclosure includes the following steps: in a sample phase, receiving a first (second) input signal with top electrodes of first (second) capacitors, and receiving a second (first) input signal with all bottom electrode(s) of at least a part of the first (second) capacitors; and in a hold phase, stopping receiving the first (second) input signal with the top electrodes of the first (second) capacitors, receiving a first (second) group of reference signals with all bottom electrodes of the first (second) capacitors, and then providing a first (second) sample voltage on the top electrodes of the first (second) capacitors by charge redistribution. In an exemplary implementation, the first and second input signals are a pair of differential signals, and they are opposite to each other when the common-mode voltage is the ground voltage; since the top electrode(s) and the bottom electrode(s) of the at least a part of the first (second) capacitors receive the first (second) input signal and the second (first) input signal in the sample phase respectively, the signal strength of a signal sampled by the at least a part of the first (second) capacitors is two times the signal strength of the first (second) input signal, and this achieves the effect of signal amplification.

Another embodiment of the sample and hold method of the present disclosure includes the following steps: in a sample phase, receiving a first (second) input signal with top electrodes of first (second) capacitors, and receiving a first (second) reference signal with all bottom electrode(s) of at least a part of the first (second) capacitors; and in a hold phase, stopping receiving the first (second) input signal with the top electrodes of the first (second) capacitors, receiving a first (second) group of reference signals with all bottom electrodes of the first (second) capacitors, and then providing a first (second) sample voltage on the top electrodes of the first (second) capacitors by charge redistribution. In an exemplary implementation, the first and second input signals are a pair of differential signals, and they are opposite to each other when the common-mode voltage is the ground voltage; and the first (second) reference signal is X times the second (first) input signal, wherein the X is a positive integer. In this exemplary implementation, since the top electrode(s) and the bottom electrode(s) of the at least a part of the first (second) capacitors receive the first (second) input signal and the first (second) reference signal in the sample phase respectively, the signal strength of a signal sampled by the at least a part of the first (second) capacitors is (1+X) times the signal strength of the first (second) input signal, and this achieves the effect of signal amplification.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure provides a sample and hold circuit and method capable of amplifying an input signal in a cost-effective way.

Figure 1:
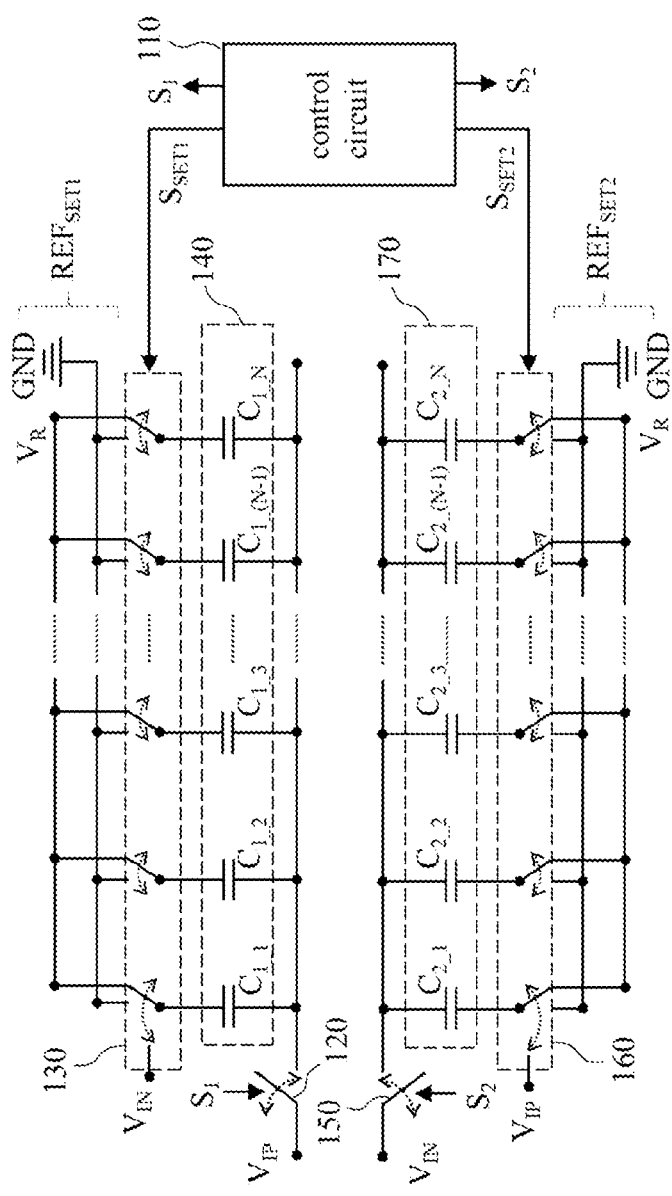
FIG. 1 shows an embodiment of the sample and hold circuit of the present disclosure.
Figure 2:
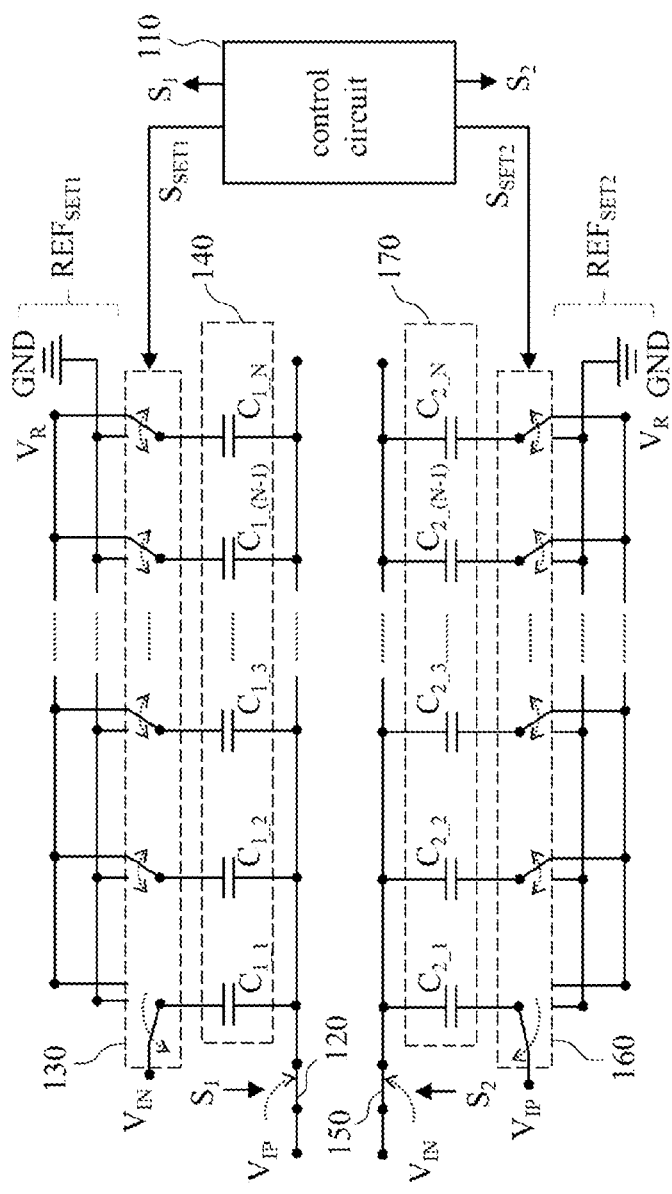
FIG. 2 shows the sample and hold circuit of FIG. 1 in the sample phase.
Figure 3:
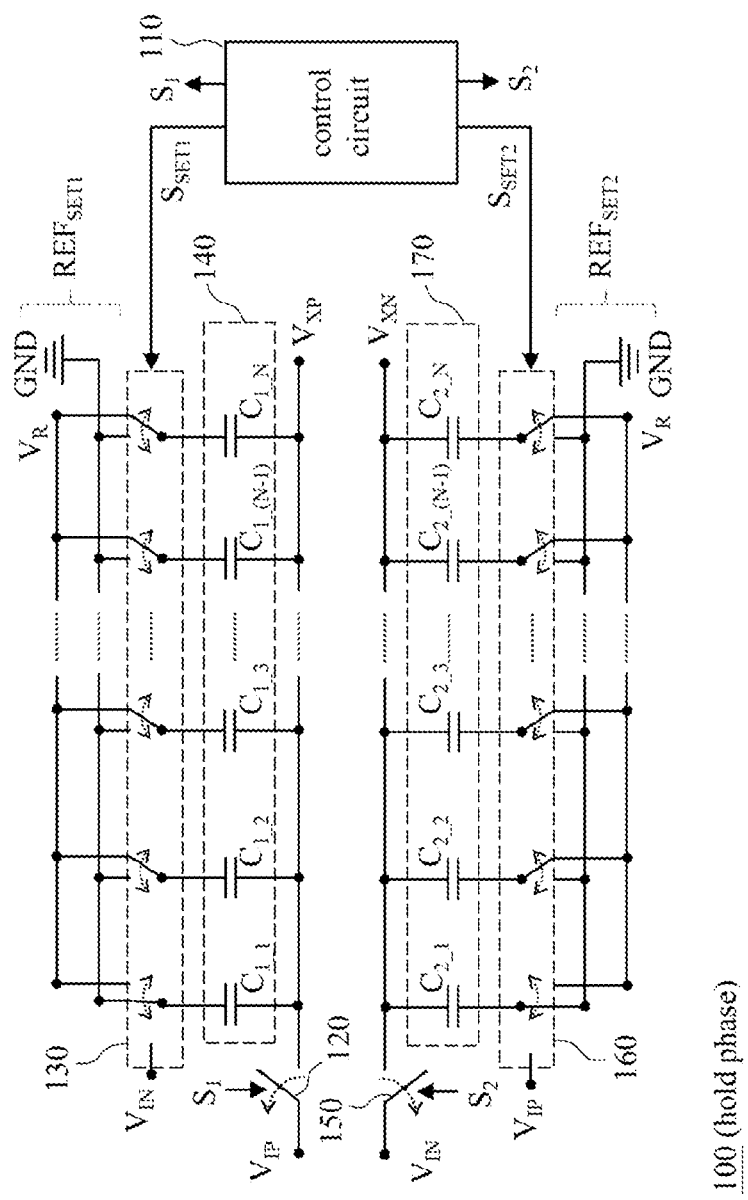
FIG. 3 shows the sample and hold circuit of FIG. 1 in the hold phase.

FIG. 1 shows an embodiment of the sample and hold circuit of the present disclosure. FIG. 2 shows the sample and hold circuit 100 of FIG. 1 in a sample phase. FIG. 3 shows the sample and hold circuit 100 in a hold phase. The sample and hold circuit 100 of FIG. 1 is applied to a successive-approximation register analog-to-digital converter (SAR ADC); however, it can be applied to other kinds of ADCs or circuits, if practicable. The sample and hold circuit 100 of FIG. 1 includes a control circuit 110, a first input switch 120, a first set of switches 130, a first capacitor array 140, a second input switch 150, a second set of switches 160, and a second capacitor array 170. These circuits are described in detail in the following paragraphs.

Please refer to FIGS. 1~3. The control circuit 110 is configured to generate a first input switch control signal $S_1$ and a first set of switch control signals $S_{SET1}$, and to generate a second input switch control signal $S_2$ and a second set of switch control signals $S_{SET2}$. In this embodiment, the first and second input switch control signals $S_1$, $S_2$ are the same and used for controlling the operations of the first input switch 120 and the second input switch 150. The first set of switch control signal $S_{SET1}$ is the same as the second set of switch control signals $S_{SET2}$ in the sample and hold phases; however, in a comparison phase of the SAR ADC, the first and second sets of switch control signals $S_{SET1}$, $S_{SET2}$ are different due to the comparison between the voltage of the first capacitor array 140 and the voltage of the second capacitor array 170. Since the SAR ADC and the comparison phase thereof are beyond the scope of the present disclosure, they are not described in detail in this specification.

Please refer to FIGS. 1~3. The first input switch 120 is configured to be turn on according to the first input switch control signal $S_1$ in the sample phase and thereby transmit a first input signal $V_{IP}$ to the first capacitor array 140; and the first input switch 120 is configured to be turned off according to the first input switch control signal $S_1$ in the hold phase and thereby stop transmitting the first input signal $V_{IP}$ to the first capacitor array 140. The second input switch 150 is configured to be turn on according to the second input switch control signal $S_2$ in the sample phase and thereby transmit a second input signal $V_{IN}$ to the second capacitor array 170; and the second input switch 150 is configured to be turned off according to the second input switch control signal $S_2$ in the hold phase and thereby stop transmitting the second input signal $V_{IN}$ to the second capacitor array 170. The first set of switches 130 is configured to operate according to the first set of switch control signals $S_{SET1}$; similarly, the second set of switches 160 is configured to operate according to the second set of switch control signals $S_{SET2}$.

Please refer to FIGS. 1~3. The first capacitor array 140 includes first capacitors ($C_{1\_1}$, $C_{1\_2}$, $C_{1\_3}$, . . . , $C_{1\_(N-1)}$, $C_{1\_N}$) coupled to the first input switch 120 and the first set of switches 130. In the sample phase, the top electrodes of the first capacitors receive the first input signal $V_{IP}$ through the first input switch 120, and all bottom electrode(s) of at least a part of the first capacitors (e.g., $C_{1\_1}$ in FIG. 2) receive(s) "the second input signal $V_{IN}$" through the first set of switches 130; in the hold phase, the top electrodes of the first capacitors do not receive the first input signal $V_{IP}$, and the bottom electrodes of the first capacitors receive a first group of reference signals $REF_{SET1}$ through the first set of switches 130. In an exemplary implementation, the first group of reference signals $REF_{SET1}$ is determined by the control circuit 110, and is composed of M reference voltage(s) $V_R$ and K ground voltages GND, wherein M, K are correlated with the first set of switch control signals $S_{SET1}$. The first capacitors provide a first sample voltage $V_{XP}$ on the top electrodes of the first capacitors by charge redistribution in the hold phase.

Similarly, the second capacitor array 170 includes second capacitors ($C_{2\_1}$, $C_{2\_2}$, $C_{2\_3}$, . . . , $C_{2\_(N-1)}$, $C_{2\_N}$) coupled to the second input switch 150 and the second set of switches 160. In the sample phase, the top electrodes of the second capacitors receive the second input signal $V_{IN}$ through the second input switch 150, and all bottom electrode(s) of at least a part of the first capacitors (e.g., $C_{2\_1}$ in FIG. 2) receive(s) "the first input signal $V_{IP}$" through the second set of switches 160; in the hold phase, the top electrodes of the second capacitors do not receive the second input signal $V_{IN}$, and the bottom electrodes of the second capacitors receive a second group of reference signals $REF_{SET2}$ through the second set of switches 160. In an exemplary implementation, the second group of reference signals $REF_{SET2}$ is determined by the control circuit 110, and is composed of P reference voltage(s) $V_R$ and Q ground voltages GND, wherein P, Q are correlated with the second set of switch control signals $S_{SET2}$. The second capacitors provide a second sample voltage $V_{XN}$ on the top electrodes of the second capacitors by charge redistribution in the hold phase. It should be noted that the first and second groups of reference signals $REF_{SET1}$, $REF_{SET2}$ are determined according to the demand for implementation and can be realized with a known/self-developed technique, and this is beyond the scope of the present disclosure.

Please refer to FIGS. 1~3. An example of the aforementioned first and second input signals $V_{IP}$, $V_{IN}$ is a pair of differential signals, and thus the first and second input signals $V_{IP}$, $V_{IN}$ are complementary. Since the top electrode(s) and the bottom electrode(s) of the at least a part of the first capacitors (e.g., $C_{1\_1}$ in FIG. 2) receive the first input signal $V_{IP}$ and the second input signal $V_{IN}$ in the sample phase respectively, the signal strength of a signal sampled by the at least a part of the first capacitors is two times the signal strength of the first input signal $V_{IP}$ (i.e., $V_{IP}-V_{IN}=V_{IP}+V_{IP}=2V_{IP}$) when the common-mode voltage is the ground voltage, and this achieves the effect of signal amplification. Similarly, since the top electrode(s) and the bottom electrode(s) of the at least a part of the second capacitors (e.g., $C_{2\_1}$ in FIG. 2) receive the second input signal $V_{IN}$ and the first input signal Yip in the sample phase respectively, the signal strength of a signal sampled by the at least a part of the second capacitors is two times the signal strength of the second input signal $V_{IN}$ (i.e., $V_{IN}-V_{IP}=V_{IN}+$ $V_{IN}$=2$V_{IN}$) when the common-mode voltage is the ground voltage, and this achieves the effect of signal amplification.

Please refer to FIGS. 2~3. The first capacitors are composed of the aforementioned at least a part of the first capacitors (e.g., $C_{1\_1}$ in FIG. 2) and a remaining part of the first capacitors (e.g., $C_{1\_2}$, $C_{1\_3}$, . . . , $C_{1\_(N-1)}$, and $C_{1\_N}$ in FIGS. 2~3); all the bottom electrode(s) of the remaining part of the first capacitors receive(s) a corresponding part of the first group of reference signals $REF_{SET1}$ through the first set of switches 130 in the sample phase. Similarly, the second capacitors are composed of the at least a part of the second capacitors (e.g., $C_{2\_1}$ in FIG. 2) and a remaining part of the second capacitors (e.g., $C_{2\_2}$, $C_{2\_3}$, . . . , $C_{2\_(N-1)}$, and $C_{2\_N}$ in FIGS. 2~3); all the bottom electrode(s) of the remaining part of the second capacitors receive(s) a corresponding part of the second group of reference signals $REF_{SET2}$ through the second set of switches 160 in the sample phase. It should be noted that the capacitance of each of the first/second capacitors is determined according to the demand for implementation. For example, the capacitance of the at least a part of the first/second capacitors (e.g., $C_{1\_1}$ or $C_{2\_1}$ in FIG. 2) is not less than the capacitance of the remaining part of the first/second capacitors (e.g., $C_{1\_2}$, $C_{1\_3}$, . . . , $C_{1\_(N-1)}$, and $C_{1\_N}$ in FIG. 2~3, or $C_{2\_2}$, $C_{2\_3}$, . . . , $C_{2\_(N-1)}$, and $C_{2\_N}$ in FIGS. 2~3). For another example, the capacitance of each of the first/second capacitors is designed according to the requirements of an SAR ADC.

Please refer to FIGS. 1~3. In an exemplary implementation, the first input signal $V_{IP}$ is equivalent to ($V_{CM}$+dV) and the second input signal YIN is equivalent to ($V_{CM}$−dV), wherein "$V_{CM}$" is a common-mode voltage and "dV" is a signal voltage. The ratio of the capacitance of the at least a part of the first capacitors (e.g., $C_{1\_1}$ in FIG. 2) to the capacitance of the remaining part of the first capacitors (e.g., $C_{1\_2}$, $C_{1\_3}$, . . . , $C_{1\_(N-1)}$, and $C_{1\_N}$ in FIGS. 2~3 in FIGS. 2~3) is $$\frac{x \times C_U}{y \times C_U} = \frac{x}{y},$$

wherein $C_U$ denotes a unit of capacitance. In the sample phase, all the bottom electrode(s) of the remaining part of the first capacitors receive(s) a reference voltage $V_R$, and thus the charge stored in the first capacitors can be measured with the following equation (1):

$$Q=(xC_U)(V_{IP}-V_{IN})+(yC_U)(V_{IP}-V_R)=(xC_U)(2dV)+ \\ (yC_U)(V_{CM}+dV-V_R)=(xC_U)(2dV)+(yC_U)V_{CM}+ \\ (yC_U)dV-(yC_U)V_R=(2xC_U+yC_U)dV+(yC_U)(V_{CM}- \\ V_R) \qquad \text{eq. (1)}$$

In the hold phase, the voltage at the top electrodes of the first capacitors is the aforementioned first sample voltage $V_{XP}$, the bottom electrode(s) of the at least a part of the first capacitors receive(s) a ground voltage GND, and the bottom electrode(s) of the remaining part of the first capacitors receive(s) the reference voltage $V_R$. Accordingly, the charge stored in the first capacitors in the hold phase can be measured with the following equation (2):

$$Q=(xC_U)(V_{XP}-0)+(yC_U)(V_{XP}-V_R)=(x+y)C_UV_{XP}- \\ yC_UV_R \qquad \text{eq. (2)}$$

According to the law of charge conservation, eq. (1) should be equal to eq. (2). Accordingly, the first sample voltage $V_{XP}$ can be expressed with the following equation:

$$V_{XP} = \frac{(2x+y)dV + y(V_{CM}-V_R)}{x+y} + \frac{y}{x+y}V_R \qquad \text{eq. (3)}$$

If the aforementioned ratio $$\frac{x}{y}$$

is equal to 1 (i.e., x=y), the first sample voltage $V_{XP}$ can be expressed with the following equation:

$$V_{XP} = \frac{(2+1)dV + (V_{CM}-V_R)}{2} + 0.5V_R = 1.5dV + 0.5V_{CM} \qquad \text{eq. (4)}$$

Assuming that the common-mode voltage is 0.5V and the reference voltage $V_R$ is 1.1V, the first sample voltage $V_{XP}$ in eq. (4) will be $$\text{``} \frac{(2+1)dV + (0.5V - 1.1V)}{2} + 0.5 \times 1.1V = \\ 1.5dV - 0.3V + 0.55V = 1.5dV + 0.25V = 1.5dV + 0.25V\text{''}.$$

Compared with the first sample voltage $V_{XP}$ in eq. (4), the first sample voltage obtained with a prior art is lower. For example, according to a prior art in the similar circumstance (i.e., $V_{IP}$=$V_{CM}$+dV; x=y; $V_{CM}$=0.5V; $V_R$=1.1V), the bottom electrode(s) of the at least a part of the first capacitors receive(s) the reference voltage $V_R$ instead of the second input signal $V_{IN}$ in the sample phase, and the charge stored in the first capacitors is $Q_1$=(x$C_U$)($V_{IP}$−$V_R$)+(y$C_U$)($V_{IP}$−$V_R$)=(x+y)×$C_U$×($V_{IP}$−$V_R$); the bottom electrode(s) of the at least a part of the first capacitors receive(s) the ground voltage GND and the bottom electrode(s) of the remaining part of the first capacitors receive(s) the reference voltage $V_R$ in the hold phase, and the charge stored in the first capacitors is $Q_2$=(x$C_U$)($V_{XP}$−0) (y$C_U$)($V_{XP}$−$V_R$)=(x+y)$C_UV_{XP}$−y$C_UV_R$; since $Q_1$ is equal to $Q_2$ under the law of charge conservation, the first sample voltage of the prior art is "dV−0.05V". In light of the above, the first sample voltage $V_{XP}$ of the present invention (e.g., 1.5 dV+0.25V) is higher than the first sample voltage of the prior art (e.g., dV−0.05V), which proves the effect of signal amplification of the present invention significant.

Since those having ordinary skill in the art can appreciate how to derive the second sample voltage $V_{XN}$ according the description of the calculation of the first sample voltage $V_{XP}$, repeated and redundant description is omitted here.

Figure 4A:
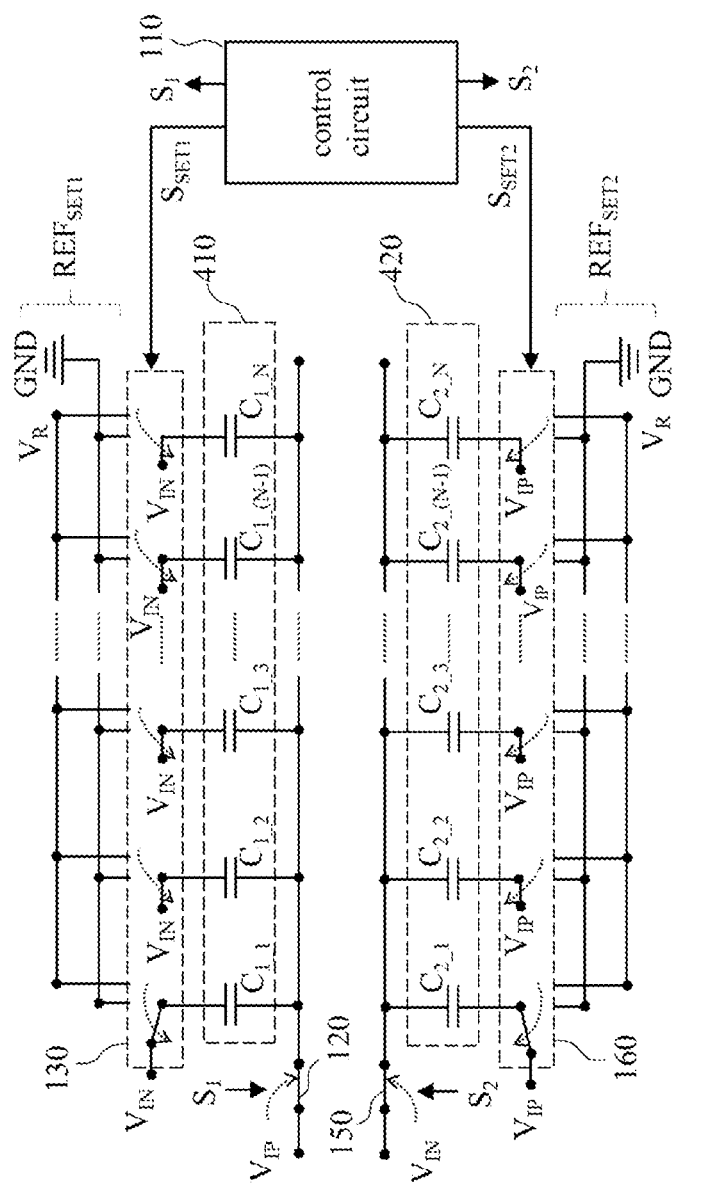
FIG. 4A shows another embodiment of the sample and hold circuit of the present disclosure.
Figure 4B:
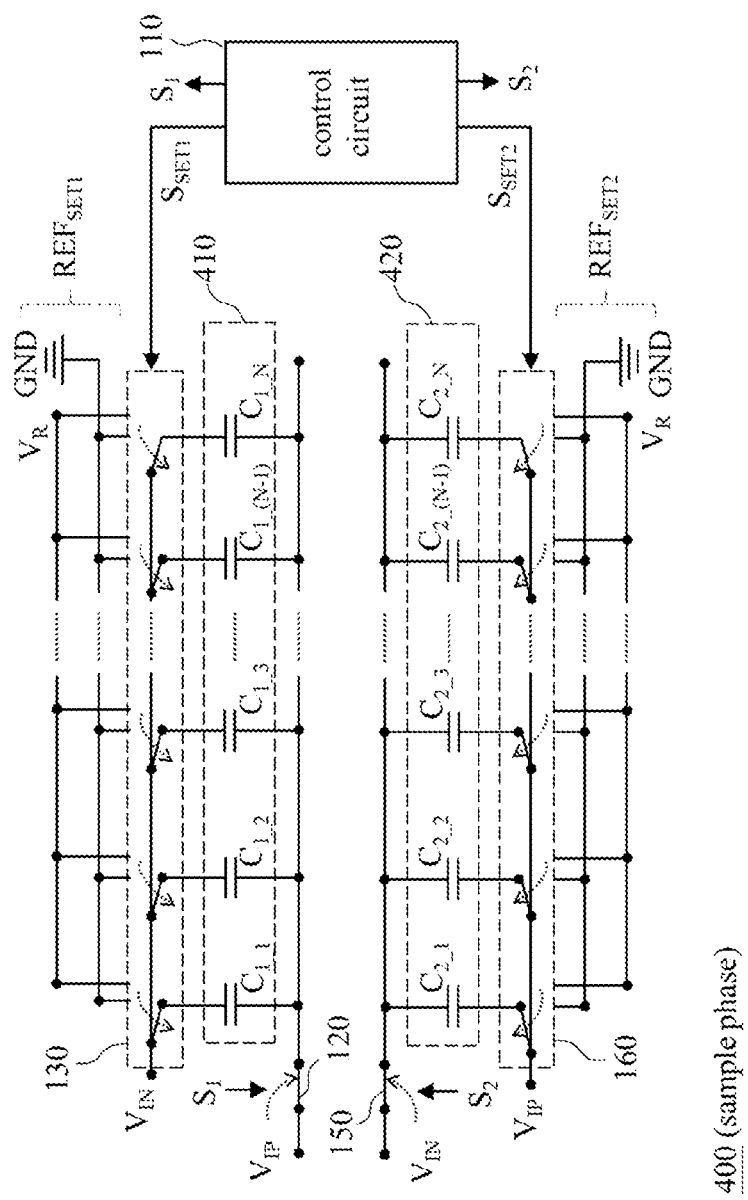
FIG. 4B shows a modification of the embodiment of FIG. 4A.

FIG. 4A shows another embodiment of the sample and hold circuit of the present disclosure. In comparison with the embodiment of FIG. 1, the bottom electrodes of all the first/second capacitors in the first/second capacitor array 410/420 receive the second/first input signal $V_{IN}$/$V_{IP}$ in the sample phase, and therefore the first/second capacitor array 410/420 can store more charge; consequently, the effect of signal amplification can be improved further. FIG. 4B shows a modification of the embodiment of FIG. 4A. Compared with FIG. 4A, the bottom electrodes of the first/second capacitor array 410/420 of FIG. 4B receive the second/first input signal $V_{IN}$/$V_{IP}$ through the same terminal instead of separate terminals.

In an alternative embodiment, the first input signal Yip is a signal voltage and the second input signal $V_{IN}$ is a constant voltage, wherein the signal voltage usually varies with time. In an alternative embodiment, the first input signal Yip and the second input signal $V_{IN}$ are complementary signals of a pair of differential signals, the bottom electrode(s) of the at least a part of the first/second capacitors receive(s) a first/second reference signal in the sample phase, and the first reference signal is different from the second reference signal. For example, the first/second reference signal is X times the second/first input signal, wherein "X" is a positive integer.

Figure 5:
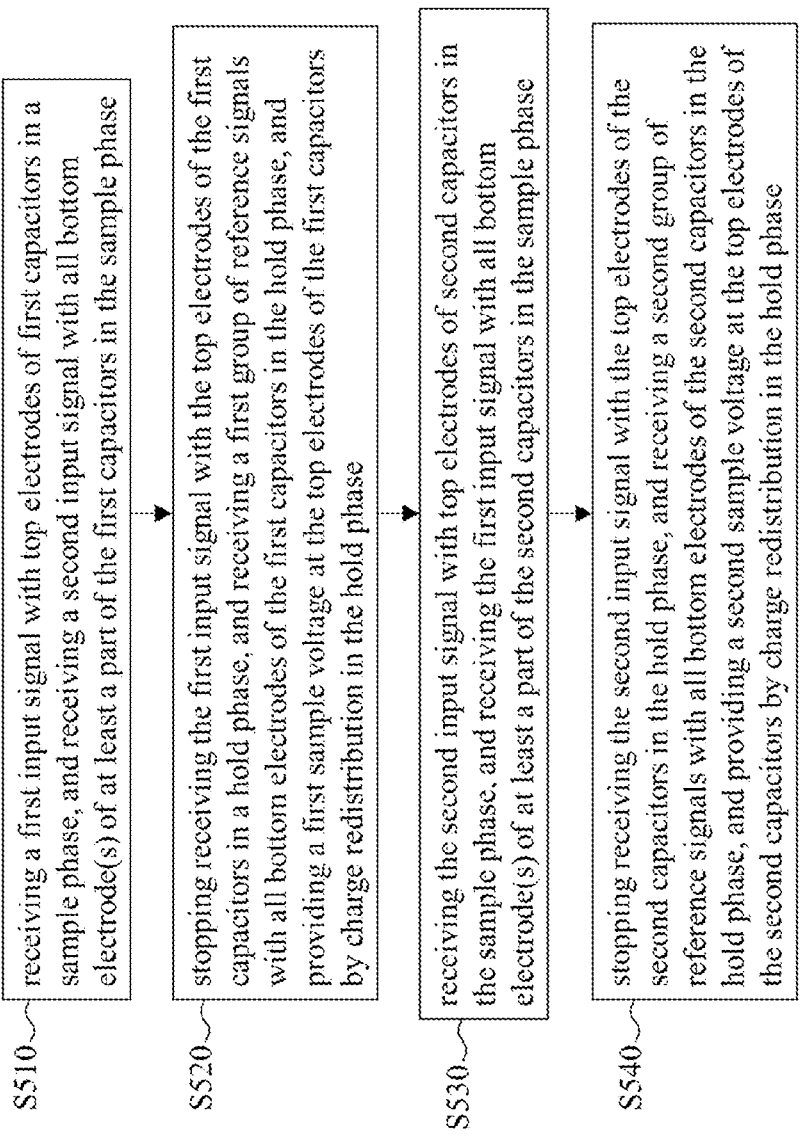
FIG. 5 shows an embodiment of the sample and hold method of the present disclosure.

FIG. 5 shows an embodiment of the sample and hold method of the present disclosure, including the following steps:

S510: receiving a first input signal with top electrodes of first capacitors in a sample phase, and receiving a second input signal with all bottom electrode(s) of at least a part of the first capacitors in the sample phase;

S520: stopping receiving the first input signal with the top electrodes of the first capacitors in a hold phase, and receiving a first group of reference signals with all bottom electrodes of the first capacitors in the hold phase, and providing a first sample voltage on the top electrodes of the first capacitors by charge redistribution in the hold phase;

S530: receiving the second input signal with top electrodes of second capacitors in the sample phase, and receiving the first input signal with all bottom electrode(s) of at least a part of the second capacitors in the sample phase; and S540: stopping receiving the second input signal with the top electrodes of the second capacitors in the hold phase, and receiving a second group of reference signals with all bottom electrodes of the second capacitors in the hold phase, and providing a second sample voltage on the top electrodes of the second capacitors by charge redistribution in the hold phase.

Figure 6:
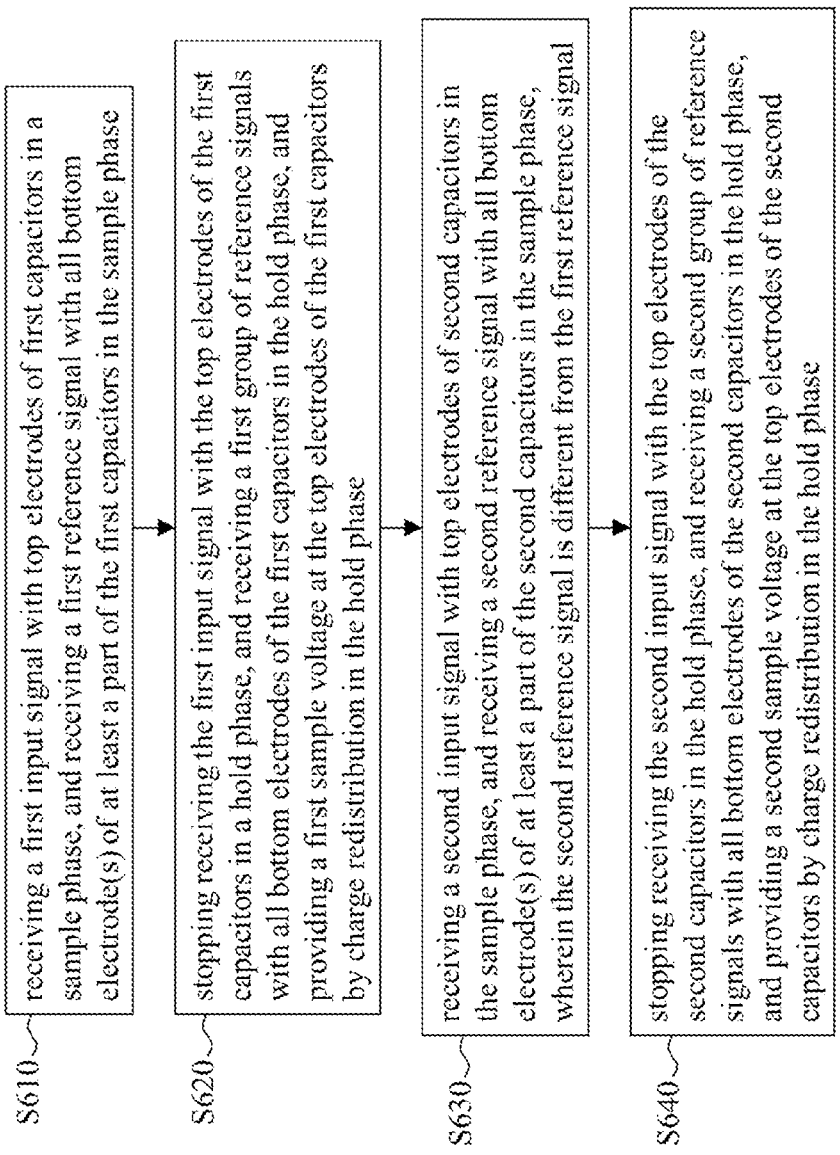
FIG. 6 shows another embodiment of the sample and hold method of the present disclosure.

FIG. 6 shows an embodiment of the sample and hold method of the present disclosure, including the following steps:

S610: receiving a first input signal with top electrodes of first capacitors in a sample phase, and receiving a first reference signal with all bottom electrode(s) of at least a part of the first capacitors in the sample phase;

S620: stopping receiving the first input signal with the top electrodes of the first capacitors in a hold phase, and receiving a first group of reference signals with all bottom electrodes of the first capacitors in the hold phase, and providing a first sample voltage on the top electrodes of the first capacitors by charge redistribution in the hold phase;

S630: receiving a second input signal with top electrodes of second capacitors in the sample phase, and receiving a second reference signal with all bottom electrode(s) of at least a part of the second capacitors in the sample phase, wherein the second reference signal is different from the first reference signal; and S640: stopping receiving the second input signal with the top electrodes of the second capacitors in the hold phase, and receiving a second group of reference signals with all bottom electrodes of the second capacitors in the hold phase, and providing a second sample voltage on the top electrodes of the second capacitors by charge redistribution in the hold phase.

Since those of ordinary skill in the art can appreciate the detail and the modification of the embodiments of FIGS. 5~6 by referring to the disclosure of the embodiments of FIGS. 1~4, which implies that some or all of the features of the embodiments of FIGS. 1~4 can be applied to the embodiments of FIGS. 5~6 in a logical way, repeated and redundant description is omitted here. It should be noted that the steps in FIG. 5/6 are not limited to a specific order, if practicable.

It should be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the sample and hold circuit and method of the present disclosure can amplify an input signal in a cost-effective way.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A sample and hold circuit, comprising:
a control circuit configured to generate a first input switch control signal and a first set of switch control signals, and to generate a second input switch control signal and a second set of switch control signals;
a first input switch configured to be turn on according to the first input switch control signal in a sample phase and thereby transmit a first input signal, and to be turned off according to the first input switch control signal in a hold phase;
a first set of switches configured to operate according to the first set of switch control signals;
a first capacitor array including first capacitors coupled to the first input switch and the first set of switches, wherein top electrodes of the first capacitors receive the first input signal through the first input switch in the sample phase, all bottom electrode(s) of at least a part of the first capacitors receive(s) a second input signal through the first set of switches in the sample phase, the top electrodes of the first capacitors do not receive the first input signal in the hold phase, all bottom electrodes of the first capacitors receive a first group of reference signals through the first set of switches in the hold phase, and the first capacitors provide a first sample voltage on the top electrodes of the first capacitors by charge redistribution in the hold phase;
a second input switch configured to be turn on according to the second input switch control signal in the sample phase and thereby transmit the second input signal, and to be turned off according to the second input switch control signal in the hold phase;
a second set of switches configured to operate according to the second set of switch control signals; and
a second capacitor array including second capacitors coupled to the second input switch and the second set of switches, wherein top electrodes of the second capacitors receive the second input signal through the second input switch in the sample phase, all bottom electrode(s) of at least a part of the second capacitors receive(s) the first input signal through the second set of switches in the sample phase, the top electrodes of the second capacitors do not receive the second input signal in the hold phase, all bottom electrodes of the second capacitors receive a second group of reference signals through the second set of switches in the hold phase, and the second capacitors provide a second sample voltage on the top electrodes of the second capacitors by charge redistribution in the hold phase.

2. The sample and hold circuit of claim 1, wherein the first capacitors are composed of the at least a part of the first capacitors and a remaining part of the first capacitors; all bottom electrode(s) of the remaining part of the first capacitors receive(s) a corresponding part of the first group of reference signals through the first set of switches in the sample phase; the second capacitors are composed of the at least a part of the second capacitors and a remaining part of the second capacitors; all bottom electrode(s) of the remaining part of the second capacitors receive(s) a corresponding part of the second group of reference signals through the second set of switches in the sample phase.

3. The sample and hold circuit of claim 2, wherein capacitance of the at least a part of the first capacitors is not less than capacitance of the remaining part of the first capacitors, and capacitance of the at least a part of the second capacitors is not less than capacitance of the remaining part of the second capacitors.

4. The sample and hold circuit of claim 1, wherein the first input signal and the second input signal are a pair of differential signals.

5. The sample and hold circuit of claim 1, wherein the first input signal is a signal voltage varying with time, and the second input signal is a constant voltage.

6. A sample and hold method performed with a sample and hold circuit, the method comprising:
receiving a first input signal with top electrodes of first capacitors in a sample phase, and receiving a second input signal with all bottom electrode(s) of at least a part of the first capacitors in the sample phase;
stopping receiving the first input signal with the top electrodes of the first capacitors in a hold phase, receiving a first group of reference signals with all bottom electrodes of the first capacitors in the hold phase, and providing a first sample voltage on the top electrodes of the first capacitors by charge redistribution in the hold phase;
receiving the second input signal with top electrodes of second capacitors in the sample phase, and receiving the first input signal with all bottom electrode(s) of at least a part of the second capacitors in the sample phase; and
stopping receiving the second input signal with the top electrodes of the second capacitors in the hold phase, receiving a second group of reference signals with all bottom electrodes of the second capacitors in the hold phase, and providing a second sample voltage on the top electrodes of the second capacitors by charge redistribution in the hold phase.

7. The sample and hold method of claim 6, wherein the first capacitors are composed of the at least a part of the first capacitors and a remaining part of the first capacitors; the second capacitors are composed of the at least a part of the second capacitors and a remaining part of the second capacitors; and the sample and hold method further comprises: receiving a corresponding part of the first group of reference signals with all bottom electrode(s) of the remaining part of the first capacitors in the sample phase; and receiving a corresponding part of the second group of reference signals with all bottom electrode(s) of the remaining part of the second capacitors in the sample phase.

8. The sample and hold method of claim 7, wherein capacitance of the at least a part of the first capacitors is not less than capacitance of the remaining part of the first capacitors, and capacitance of the at least a part of the second capacitors is not less than capacitance of the remaining part of the second capacitors.

9. The sample and hold method of claim 6, wherein the first input signal and the second input signal are a pair of differential signals.

10. The sample and hold method of claim 6, wherein the first input signal is a signal voltage varying with time, and the second input signal is a constant voltage.

11. A sample and hold method performed with a sample and hold circuit, the method comprising:
receiving a first input signal with top electrodes of first capacitors in a sample phase, and receiving a first reference signal with all bottom electrode(s) of at least a part of the first capacitors in the sample phase;
stopping receiving the first input signal with the top electrodes of the first capacitors in a hold phase, receiving a first group of reference signals with all bottom electrodes of the first capacitors in the hold phase, and providing a first sample voltage on the top electrodes of the first capacitors by charge redistribution in the hold phase;
receiving a second input signal with top electrodes of second capacitors in the sample phase, and receiving a second reference signal with all bottom electrode(s) of at least a part of the second capacitors in the sample phase, wherein the second reference signal is different from the first reference signal; and
stopping receiving the second input signal with the top electrodes of the second capacitors in the hold phase, receiving a second group of reference signals with all bottom electrodes of the second capacitors in the hold phase, and providing a second sample voltage on the top electrodes of the second capacitors by charge redistribution in the hold phase.

12. The sample and hold method of claim 11, wherein the first capacitors are composed of the at least a part of the first capacitors and a remaining part of the first capacitors; the second capacitors are composed of the at least a part of the second capacitors and a remaining part of the second capacitors; and the sample and hold method further comprises: receiving a corresponding part of the first group of reference signals with all bottom electrode(s) of the remaining part of the first capacitors in the sample phase; and receiving a corresponding part of the second group of reference signals with all bottom electrode(s) of the remaining part of the second capacitors in the sample phase.

13. The sample and hold method of claim 12, wherein capacitance of the at least a part of the first capacitors is not less than capacitance of the remaining part of the first capacitors, and capacitance of the at least a part of the second capacitors is not less than capacitance of the remaining part of the second capacitors.

14. The sample and hold method of claim 11, wherein the first input signal and the second input signal are a pair of differential signals.

15. The sample and hold method of claim 11, wherein the first input signal is a signal voltage varying with time, and the second input signal is a constant voltage.

* * * * *